(12) United States Patent
Lobianco et al.

(10) Patent No.: US 9,564,937 B2
(45) Date of Patent: Feb. 7, 2017

(54) DEVICES AND METHODS RELATED TO PACKAGING OF RADIO-FREQUENCY DEVICES ON CERAMIC SUBSTRATES

(71) Applicant: SKYWORKS SOLUTIONS, INC., Woburn, MA (US)

(72) Inventors: Anthony James Lobianco, Irvine, CA (US); Howard E. Chen, Anaheim, CA (US); David Scott Whitefield, Andover, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/528,447

(22) Filed: Oct. 30, 2014

(65) Prior Publication Data

US 2015/0126134 A1 May 7, 2015

Related U.S. Application Data

(60) Provisional application No. 61/900,394, filed on Nov. 5, 2013.

(51) Int. Cl.
*H04B 1/38* (2015.01)
*H05K 9/00* (2006.01)
(Continued)

(52) U.S. Cl.
CPC .............. *H04B 1/38* (2013.01); *H01L 21/481* (2013.01); *H01L 23/15* (2013.01); *H05K 9/0026* (2013.01); *H01L 21/67236* (2013.01); *H01L 23/06* (2013.01); *H01L 23/3121* (2013.01); *H01L 24/94* (2013.01); *H01L 2224/16225* (2013.01); *H01L 2224/32225* (2013.01); *H01L 2224/73204* (2013.01); *Y10T 29/49128* (2015.01)

(58) Field of Classification Search
CPC ... H04B 1/38; H05K 9/0026; Y10T 29/49128; H01L 2224/16225; H01L 2224/32225; H01L 2224/73204; H01L 21/481; H01L 21/67236; H01L 23/3121; H01L 23/15; H01L 23/06; H01L 24/94
See application file for complete search history.

(56) References Cited

U.S. PATENT DOCUMENTS 7,342,303 B1 * 3/2008 Berry ...................... H01L 23/29
257/703
2005/0026647 A1 * 2/2005 Li ............................. H04B 1/38
455/552.1

(Continued)

*Primary Examiner* — Julio J Maldonado
*Assistant Examiner* — Farun Lu
(74) *Attorney, Agent, or Firm* — Chang & Hale LLP (57) ABSTRACT

Devices and methods related to packaging of radio-frequency (RF) devices on ceramic substrates. In some embodiments, a packaged electronic device can include a ceramic substrate configured to receive one or more components. The ceramic substrate can include a conductive layer in electrical contact with a ground plane. The packaged electronic device can further include a die having an integrated circuit and mounted on a surface of the ceramic substrate. The packaged electronic device can further include a conformal conductive coating implemented over the die to provide shielding functionality. The packaged electronic device can further include an electrical connection between the conformal conductive coating and the conductive layer.

20 Claims, 7 Drawing Sheets

(51) Int. Cl.
*H01L 21/48* (2006.01)
*H01L 21/67* (2006.01)
*H01L 23/15* (2006.01)
*H01L 23/31* (2006.01)
*H01L 23/06* (2006.01)
*H01L 23/00* (2006.01)

(56) References Cited

U.S. PATENT DOCUMENTS

2012/0319302 A1* 12/2012 Lee .................... H01L 23/3121
  257/787
2013/0307628 A1* 11/2013 Ma .......................... H01L 23/66
  330/296
2013/0320513 A1* 12/2013 Lin ........................ H01L 23/552
  257/659

* cited by examiner

DEVICES AND METHODS RELATED TO PACKAGING OF RADIO-FREQUENCY DEVICES ON CERAMIC SUBSTRATES

CROSS-REFERENCE TO RELATED APPLICATION(S)

This application claims priority to U.S. Provisional Application No. 61/900,394 filed Nov. 5, 2013, entitled DEVICES AND METHODS RELATED TO PACKAGING OF RADIO-FREQUENCY DEVICES ON CERAMIC SUBSTRATES, the disclosure of which is hereby expressly incorporated by reference herein in its entirety.

BACKGROUND

Field

The present disclosure generally relates to shielding of packaged radio-frequency (RF) modules.

Description of the Related Art

Electromagnetic (EM) fields can be generated from or have an undesirable effect on a region of a radio-frequency (RF) device such as an RF module. Such an EM interference (EMI) can degrade the performance of wireless devices that use such an RF module. Some RF modules can be provided with EM shields to address such performance issues associated with EMI.

SUMMARY

According to some implementations, the present disclosure relates to a packaged electronic device that includes a ceramic substrate configured to receive one or more components. The ceramic substrate includes a conductive layer in electrical contact with a ground plane. The packaged electronic device further includes a die having an integrated circuit. The die is mounted on a surface of the ceramic substrate. The packaged electronic device further includes a conformal conductive coating implemented over the die to provide shielding functionality. The packaged electronic device further includes an electrical connection between the conformal conductive coating and the conductive layer.

In some embodiments, the conformal conductive coating can be implemented substantially directly on the die. The conformal conductive coating directly on the die can result in the packaged electronic device being a low-profile shielded device.

In some embodiments, the die can be configured as a flip-chip device. The packaged electronic device can further include an underfill implemented between the flip-chip device and the ceramic substrate. The underfill can include an edge profile configured to provide an angled transition between side walls of the flip-chip device and the surface of the ceramic substrate. The angled transition profile of the underfill can be configured to facilitate improved coverage of the conformal conductive coating between the flip-chip device and the ceramic substrate.

In some embodiments, the integrated circuit can include a radio-frequency (RF) switching circuit. In some embodiments, the die can be a silicon-on-insulator (SOI) die.

In some embodiments, the electrical connection can include a portion of the conformal conductive coating on the surface of the ceramic substrate and a plurality of conductive vias configured to provide electrical connection between the conformal conductive coating on the surface of the ceramic substrate and the conductive layer. The conductive layer can include one or more conductive strips implemented within the ceramic substrate. The conductive layer can include a plurality of the conductive strips arranged to generally form a perimeter at or near the edges of the ceramic substrate. Each of the one or more conductive strips can at least partially overlap laterally with the corresponding conductive vias.

In some embodiments, the electrical connection can include a portion of the conformal conductive coating on the surface of the ceramic substrate extending to side edges of the ceramic substrate. The conductive layer can include an edge along the corresponding side edge of the ceramic substrate such that the edge of the conductive layer is in electrical contact with the conformal conductive coating. The conductive layer can include a conductive strip along the corresponding side edge of the ceramic substrate. The conductive strip can include an edge exposed sufficiently on the corresponding side edge of the ceramic substrate to facilitate the electrical contact between the conductive strip and the conformal conductive coating. The conductive layer can include a plurality of the conductive strips arranged such that each edge of the ceramic substrate includes the corresponding exposed edge of the conductive strip in electrical contact with the conformal conductive coating.

In some embodiments, the conformal conductive coating can include a metallic paint layer or a conductive layer formed by deposition. In some embodiments, the ceramic substrate can include a low-temperature co-fired ceramic (LTCC) substrate. In some embodiments, the packaged electronic device can further include a plurality of contact pads implemented on an underside of the ceramic substrate. The contact pads can be configured to allow mounting of the packaged electronic device on a circuit board. In some embodiments, the packaged electronic device can further include an overmold implemented over the die such that the conformal coating is implemented on a surface of the overmold. The overmold can be dimensioned such that its side walls generally align with corresponding side walls of the ceramic substrate.

In a number of implementations, the present disclosure relates to a wireless device that includes a transceiver configured to generate a radio-frequency (RF) signal, and an RF module configured to process the RF signal. The RF module includes a ceramic substrate configured to receive one or more components. The ceramic substrate includes a conductive layer in electrical contact with a ground plane. The RF module further includes a die having an integrated circuit, with the die being mounted on a surface of the ceramic substrate. The RF module further includes a conformal conductive coating implemented over the die to provide shielding functionality. The RF module further includes an electrical connection between the conformal conductive coating and the conductive layer. The wireless device further includes an antenna in communication with the RF module. The antenna is configured to facilitate transmission of the processed RF signal.

In some implementations, the present disclosure relates to a method for fabricating a packaged radio-frequency (RF) module. The method includes forming or providing a ceramic substrate configured to receive one or more components. The ceramic substrate includes a conductive layer in electrical contact with a ground plane. The method further includes mounting a die on a surface of the ceramic substrate, with the die including an integrated circuit. The method further includes forming a conformal conductive coating over the die and in electrical contact with the conductive layer to thereby provide shielding functionality for the die.

In some embodiments, the ceramic substrate can include a plurality of ceramic layers arranged in a stack having an array of units defined by a grid of lines along which a singulation process results in separation of the units into a plurality of individual units. The method can further include singulating the array of units prior to the forming of the conformal conductive coating. The mounting of the die can be performed on each of the units prior to the singulating step.

According to some teachings, the present disclosure relates to a ceramic substrate for fabricating a plurality of packaged radio-frequency (RF) modules. The ceramic substrate includes a plurality of ceramic layers arranged in a stack having an array of units. Each unit is configured to receive one or more components. The array of units is defined by a grid of lines along which a singulation process results in separation of the units into a plurality of individual units. The ceramic substrate further includes a ground plane implemented within the stack. The ceramic substrate further includes a conductive layer implemented within the stack and in electrical contact with the ground plane. The conductive layer is configured so that upon the singulation process, at least one edge of each individual unit includes an exposed edge of the conductive layer.

In some embodiments, the conductive layer can include a conductive strip implemented along a corresponding one of the grid of lines, such that the singulation process along the line results in two neighboring units to be separated with each having a cut edge of the conductive strip as the exposed edge. In some embodiments, the ceramic substrate can further include one or more of a dielectric layer, a passive component, and a conductor feature. The passive component can include a resistive element, a capacitive element, or an inductive element. The conductor feature can include a conductor trace or a conductive via. In some embodiments, the ceramic substrate can include a low-temperature co-fired ceramic (LTCC) substrate.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Disclosed herein are various examples of how radio-frequency (RF) devices such as flip-chip die can be mounted on a packaging substrate such as a ceramic substrate and be shielded. Although described in the context of flip-chip die, it will be understood that one or more features of the present disclosure can be implemented in other applications, including those involving non-flip-chip die. It will also be understood that one or more features of the present disclosure can also be implemented in other types of non-ceramic substrates.

Figure 1:
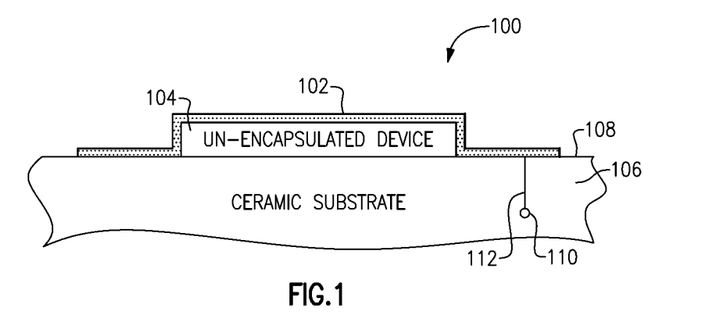
FIG. 1 shows a shielded packaged device that includes an un-encapsulated device mounted on a substrate such as a ceramic substrate.

FIG. 1 shows an example of a shielded packaged device 100 that includes an un-encapsulated device 104 mounted on a ceramic substrate 106. As described herein, such an un-encapsulated device can be, for example, a flip-chip. As described herein, such a flip-chip 104 mounted on the ceramic substrate 106 can be shielded without use of an overmold, thereby allowing, for example, reduced height of the packaged device 100. For example, the overall height of the packaged device 100 can be made to be less than an example specification of 0.65 mm.

In the example of FIG. 1, the packaged device 100 is shown to include a conformal coating 102 of conductive material that substantially covers the un-encapsulated device 104 and some or all of an exposed portion of an upper surface 108 of the ceramic substrate 106. Such a conformal coating can be electrically connected to a ground node 110 within the ceramic substrate by an electrical connection configuration 112. Various examples of how such electrical connections can be implemented are described herein in greater detail.

As described herein, the un-encapsulated device 102 can include, for example, a die having one or more switching circuits. Die having other types of RF circuits can also be utilized. In some embodiments, such a switching die can include a silicon-on-insulator (SOI) die. Other types of process technologies can also be implemented. As described herein, the ceramic substrate 106 can include, for example a low-temperature co-fired ceramic (LTCC) substrate, a high-temperature co-fired (HTCC) substrate, or other types of ceramic materials and/or configurations.

Figure 2:
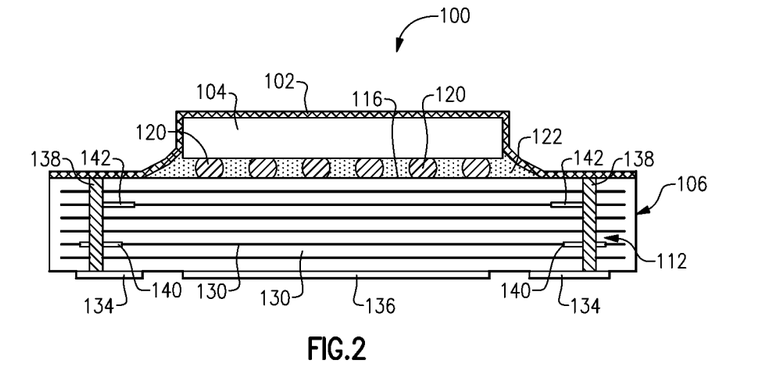
FIG. 2 shows a more specific example of the packaged device of FIG. 1, where a flip-chip is shown to be mounted on a ceramic substrate such as a low-temperature co-fired ceramic (LTCC) substrate.

FIG. 2 shows an example configuration 100 that can be a more specific example of the packaged device of FIG. 1. In the example, a flip-chip 104 such as an SOI switching die is shown to be mounted on a ceramic substrate 106 such as an LTCC substrate. Such a mounting of the flip-chip 104 on the ceramic substrate 106 can be facilitated by an array of solder balls 120. Such solder balls 120 can provide mechanical mounting functionality, as well as electrical connections between the flip-chip 104 and contact pads formed on a mounting surface 116 of the ceramic substrate 106.

As shown in FIG. 2, an underfill 122 can be formed between the flip-chip 104 and the ceramic substrate 106. Such an underfill can be configured near the edges of the flip-chip 104 so as to facilitate easier formation of a conformal coating 102 of conductive material. For example, the peripheral portion of the underfill 122 is shown to provide an angled transition between the vertical edges of the flip-chip 104 and the horizontal surface 116 of the ceramic substrate 106.

In some embodiments, the conformal coating 102 can be formed by application of conductive material by, for example, spraying or various deposition methods. Such a coating of conductive material can provide shielding functionality of portions it covers. The overall shielding performance for the packaged device 100 can be greatly enhanced by also providing lateral shielding at or near the edges of the ceramic substrate 106, as well as a ground plane underneath the flip-chip 104.

Figure 3:
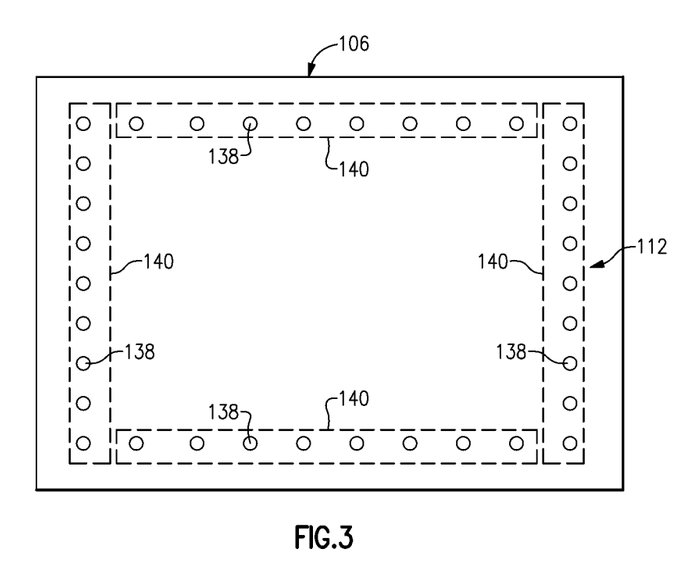
FIG. 3 shows that conductive strips can be implemented within the ceramic substrate of FIG. 2, and the conductive strips can be electrically connected to a plurality of conductive vias which in turn can be electrically connected to a conductive layer formed over the ceramic substrate.

In the example shown in FIG. 2, an electrical connection configuration 112 can include a plurality of conductive vias 138 in electrical contact with the conductive coating 102 on the surface 116 of the ceramic substrate 106. As shown in FIG. 3, such conductive vias can be distributed to form a perimeter; and the vias 138 can be spaced appropriately to provide lateral shielding between a region within the perimeter and outside of the perimeter. Although described in the context of such a perimeter, it will be understood that one or more features of the present disclosure can also be implemented in configurations where such lateral shielding does not form a complete perimeter. For example, such conductive vias can be provided so as to facilitate intra-module shielding functionality without having to form a complete perimeter about a given region.

In the example shown in FIG. 2, the electrical connection configuration 112 can further include one or more conductive layers (e.g., 140, 142) that are implemented within the ceramic substrate 106 so as to be in electrical contact with the conductive vias 138. Such conductive layers 140, 142 can be in electrical contact with a ground plane that is also within the ceramic substrate 106.

An example of the conductive layer 140 is shown in FIG. 3. Such a layer can include a plurality of conductive strips positioned along the perimeter formed by the conductive vias 138. In the example shown, each of the conductive strips 140 is shown to be positioned laterally so as to intersect with respective vias 138. For the example conductive layer 142 of FIG. 2, each strip does not necessarily need to overlap completely with respective vias 138, so long as it forms electrical contacts with the vias 138. Other configurations of the vias 138 and the conductive layers 140, 142 are also possible.

As shown in FIG. 2, the ceramic substrate 106 can include a plurality of layers and features 130. Such layers and features can include, for example, dielectric layers, passive components (such as resistors, capacitors and inductors), conductor features (such as vias and traces), and a ground plane. In such a context, the example conductive layers 140, 142 can be formed at selected lateral locations and/or at selected layers.

As also shown in FIG. 2, the packaged device 100 can include contact pads 134, 136 that allow mounting of the packaged device 100 on a circuit board (e.g., a phone board) and facilitate electrical connections between the packaged device 100 and the circuit board.

Figure 4:
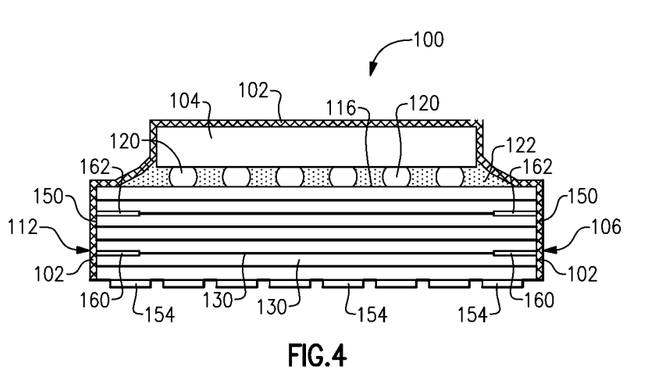
FIG. 4 shows a configuration that can be implemented as a more specific example of the packaged device of FIG. 1.

FIG. 4 shows another example configuration 100 that can be a more specific example of the packaged device of FIG. 1. In the example, a flip-chip 104 such as an SOI switching die is shown to be mounted on a ceramic substrate 106 such as an LTCC substrate. Such a mounting of the flip-chip 104 on the ceramic substrate 106 can be facilitated by an array of solder balls 120. Such solder balls 120 can provide mechanical mounting functionality, as well as electrical connections between the flip-chip 104 and contact pads formed on a mounting surface 116 of the ceramic substrate 106.

As shown in FIG. 4, an underfill 122 can be formed between the flip-chip 104 and the ceramic substrate 106. Such an underfill can be configured near the edges of the flip-chip 104 so as to facilitate easier formation of a conformal coating 102 of conductive material. For example, the peripheral portion of the underfill 122 is shown to provide an angled transition between the vertical edges of the flip-chip 104 and the horizontal surface 116 of the ceramic substrate 106.

In some embodiments, the conformal coating 102 can be formed by application of conductive material by, for example, spraying or various deposition methods. Such a coating of conductive material can provide shielding functionality of portions it covers. The overall shielding performance for the packaged device 100 can be greatly enhanced by also providing lateral shielding at the edges of the ceramic substrate 106, as well as a ground plane underneath the flip-chip 104.

In the example shown in FIG. 4, an electrical connection configuration 112 can include the conformal conductive coating 102 extending from the upper surface 116 of the ceramic substrate 106 to generally cover the side edges of the ceramic substrate 106. Such conformal conductive coating 102 covering the side edges of the ceramic substrate 106 are shown to be in electrical contact with one or more conductive layers within the ceramic substrate 106 and extending to their respective edges of the ceramic substrate 106. For example, conductive layers 160, 162 are shown to be implemented so that their edges generally align with respective edges (150) of the ceramic substrate 106. Accordingly, the conductive layers 160, 162 are shown to be in electrical contact with the conformal conductive coating 102. Thus, combined with the ground plane (in electrical contact with the conductive layers 160, 162), the conformal conductive coating 102 provides shielding functionality for the packaged device.

As shown in FIG. 4, the ceramic substrate 106 can include a plurality of layers and features 130. Such layers and features can include, for example, dielectric layers, passive components (such as resistors, capacitors and inductors), conductor features (such as vias and traces), and a ground plane. In such a context, the example conductive layers 160, 162 can be formed at selected lateral locations and/or at selected layers. In some embodiments, the conductive layers 160, 162 can be formed by, for example, patterned printing of conductive material such as silver.

As also shown in FIG. 4, the packaged device 100 can include contact pads 154 that allow mounting of the packaged device 100 on a circuit board (e.g., a phone board) and facilitate electrical connections between the packaged device 100 and the circuit board.

Figure 5:
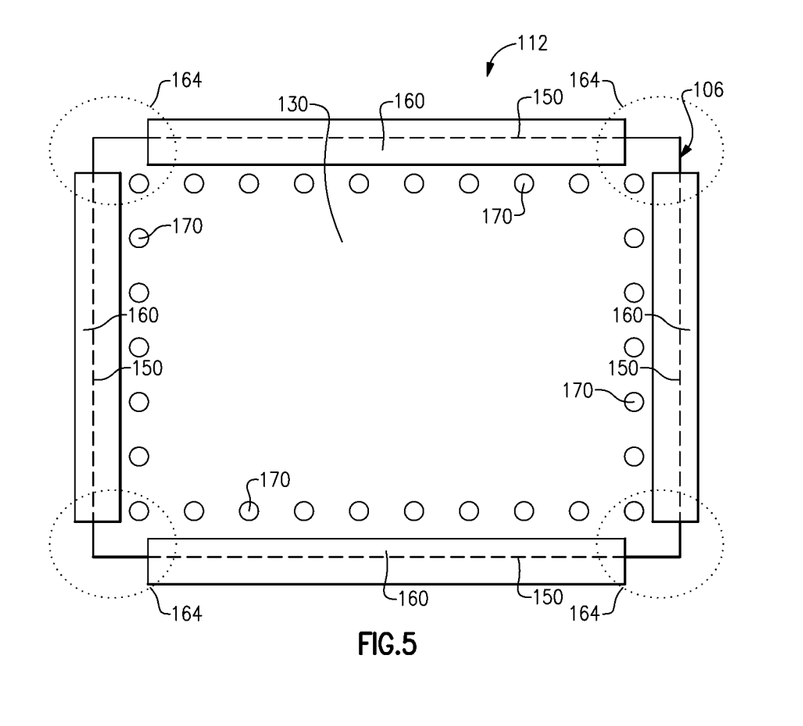
FIG. 5 shows an example of how a conductive layer can be implemented so as to form an exposed edge along one or more edges of a substrate such as a ceramic substrate.

FIG. 5 shows an example of how a conductive layer such as the example layer 160 (also described in reference to FIG. 4) can be implemented so as to form an exposed edge along the edge 150 of the ceramic substrate 106. In the example, the layer 160 is shown to include a conductive strip along each edge 150. Such strips can be positioned along cut lines between neighboring units of ceramic substrate 106 defined in an array (e.g., in a panel). Upon singulation of the array into individual units, the resulting edges can form the edges 150 of the individual ceramic substrate 106. Along the edges of the ceramic substrate 106, the cut portions of the conductive strips 160 can form exposed conductive edges for forming electrical contacts with the conformal conductive coating 102. As described in reference to FIG. 4, such a conformal conductive coating can include a portion that covers some or all of the edges of the ceramic substrate 106 and some or all of the corresponding exposed edges of the conductive strips 160.

As shown in FIG. 5, the conductive strips 160 do not necessarily need to form a complete perimeter around the ceramic substrate 106. For example, the corner portions indicated as 164 can have gaps that are dimensioned sufficiently small to provide shielding functionality. In FIG. 5, a plurality of vias 170 can be configured to provide various electrical connections and/or heat transfer functionalities.

Figure 6:
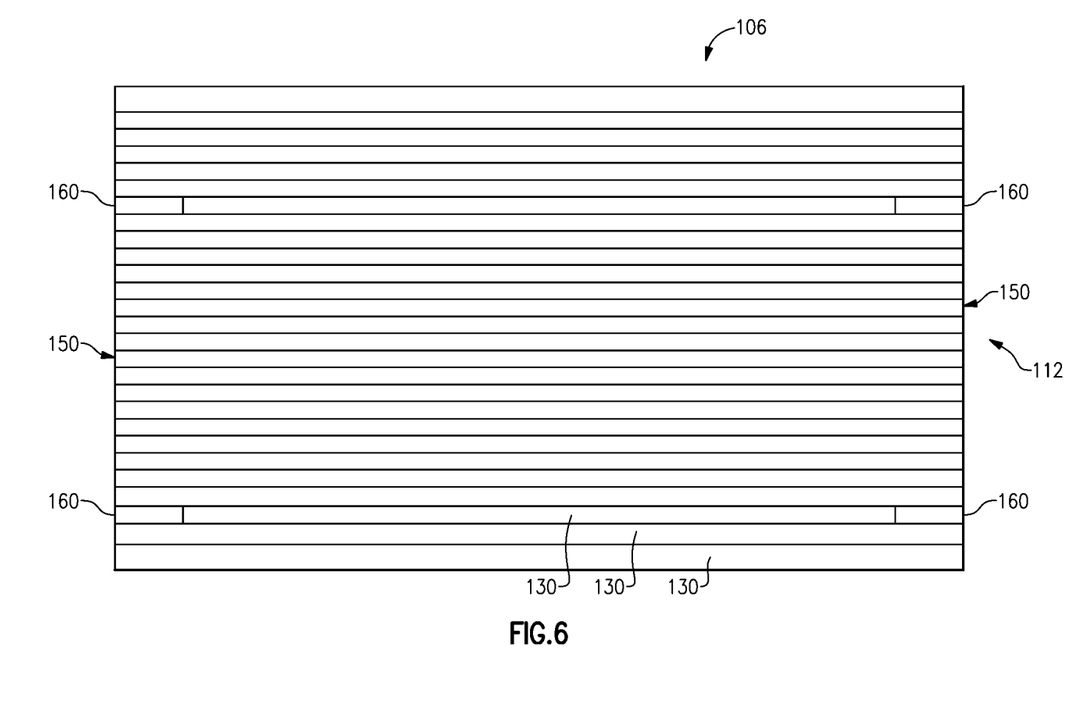
FIG. 6 shows that in some embodiments, a ceramic substrate can be configured to yield an electrical connection capability through exposed edge(s) of a conductive layer such as the example of FIG. 5.

FIG. 6 shows that in some embodiments, a ceramic substrate 106 can be configured to yield an electrical connection 112 having one or more features as described herein. As shown, such a ceramic substrate can include a plurality of layers 130 and/or features as described herein. As also described herein, such a ceramic substrate can include one or more conductive features 160 that are within the ceramic substrate 106 and positioned to be at least partially exposed on the edges 150.

Figure 7:
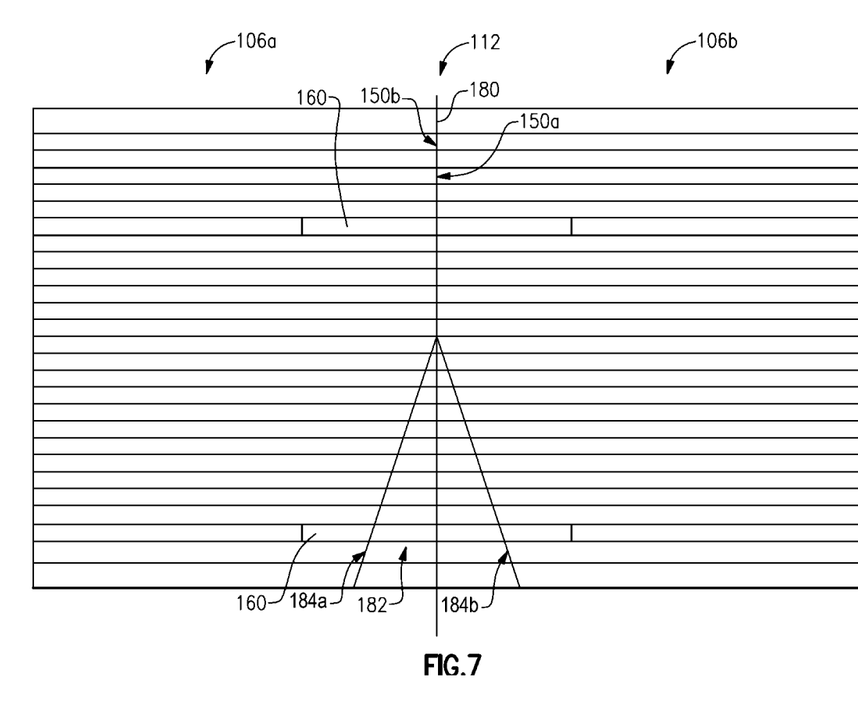
FIG. 7 shows an example where an array of units of ceramic substrate can be singulated into a plurality of individual units.

In the example of FIG. 6, the ceramic substrate 106 is depicted as having a generally 90-degree cut to define vertical edges 150. In some embodiments, singulating operations can yield non-vertical surfaces along such edges. For example, FIG. 7 shows that in some embodiments, an array of individual units (e.g., 106a, 106b) of ceramic substrate can be processed and singulated along a cut line 180. Such a singulation configuration can be facilitated by, for example, a V-shaped groove 182 formed along the delineation line 180 prior to the firing process when the substrate material is relatively soft. Upon completion of the firing process, the resulting hardened ceramic substrate can be singulated by, for example, breaking the individual units along the delineation line 180. Such a breaking operation can be facilitated by the V-shaped grooves.

In such singulated ceramic substrates 106a, 106b, exposed portions of the conductive layers 160 along the surfaces 184a, 184b of the V-groove 182 can form electrical contacts with their respective conformal conductive coatings.

Figure 8:
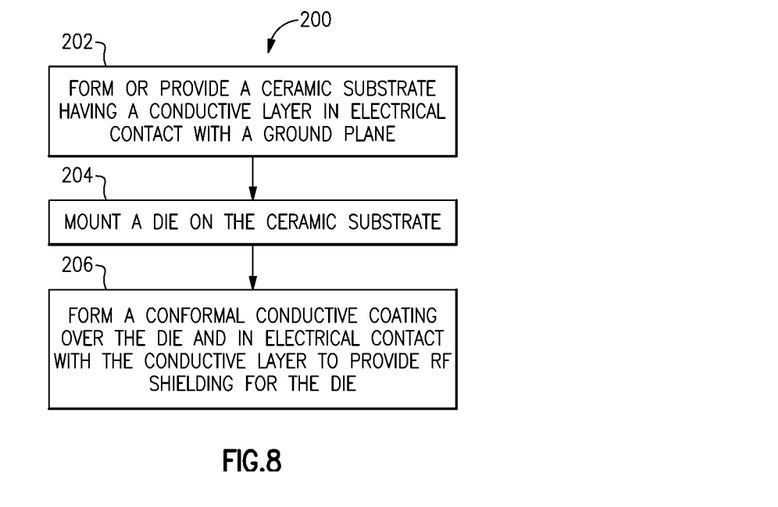
FIG. 8 shows a process that can be implemented to fabricate a shielded RF module having one or more features as described herein.

FIG. 8 shows a process 200 that can be implemented to fabricate a packaged radio-frequency (RF) module. In block 202, a ceramic substrate having a conductive layer and a ground plane can be formed or provided. The conductive layer and the ground plane can be electrically connected. In block 204, a die can be mounted on the ceramic substrate. In block 206, a conformal conductive coating can be formed over the die and in electrical contact with the conductive layer to thereby provide RF shielding for the die.

In some embodiments, the ceramic substrate can be in a form of a panel during at least some of the steps of the process 200 of FIG. 8. Such a panel can include a plurality of ceramic layers arranged in a stack, and the panel can include an array of units defined by a grid of lines. It will be understood that such a grid of lines does not necessarily exist physically on the panel, and can be implemented as, for example, singulating instructions and/or data. Singulation along such a grid of lines can result in separation of the units into a plurality of individual units. In the context of the examples of FIGS. 4-7 where conformal conductive coating can be applied to the side walls of a ceramic substrate, such a coating step can be performed after the singulation step. In some embodiments, the mounting of the die can be performed on each of the units prior to the singulating step.

In the example described herein in reference to FIG. 4, a die mounted on a ceramic substrate 106 is depicted as an un-encapsulated flip-chip 104. As described herein, such a ceramic substrate can facilitate grounding of a conformal conductive coating formed over the un-encapsulated flip-chip.

Figure 9:
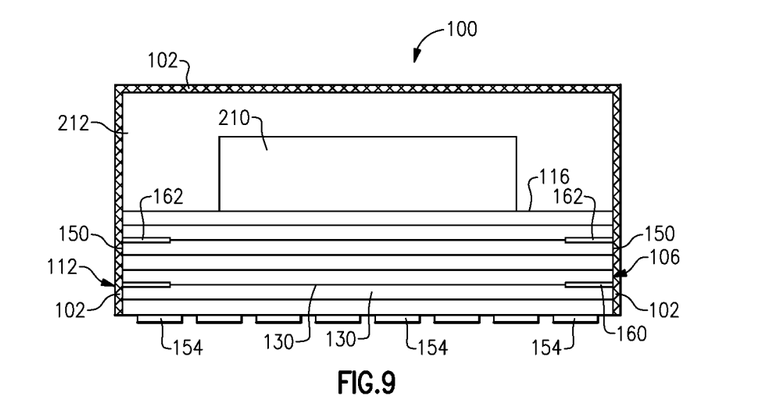
FIG. 9 shows that a ceramic substrate having one or more features as described herein can be utilized for a shielded RF module having an overmold.

FIG. 9 shows that in some embodiments, a ceramic substrate 106 having one or more features as described herein can also be utilized in packaging applications that utilize encapsulation of one or more components mounted on ceramic substrate 106. For example, a shielded packaged device 100 can include a die 210 configured to provide RF functionality, mounted on the ceramic substrate 106 which can be configured in a similar manner as in the example of FIG. 4. The die 210 is shown to be encapsulated by an overmold 212, and a conformal conductive coating 102 is shown to generally cover the upper surface and side walls of the overmold 212 and the side walls of the ceramic substrate 106. As described in reference to FIG. 4, conductive layers 160, 162 can be configured to provide electrical connection between the conformal conductive coating 102 and a ground plane within the ceramic substrate 106.

In some implementations, a device having one or more features described herein can be included in an RF device such as a wireless device. In some embodiments, such a wireless device can include, for example, a cellular phone, a smart-phone, a hand-held wireless device with or without phone functionality, a wireless tablet, etc.

Figure 10:
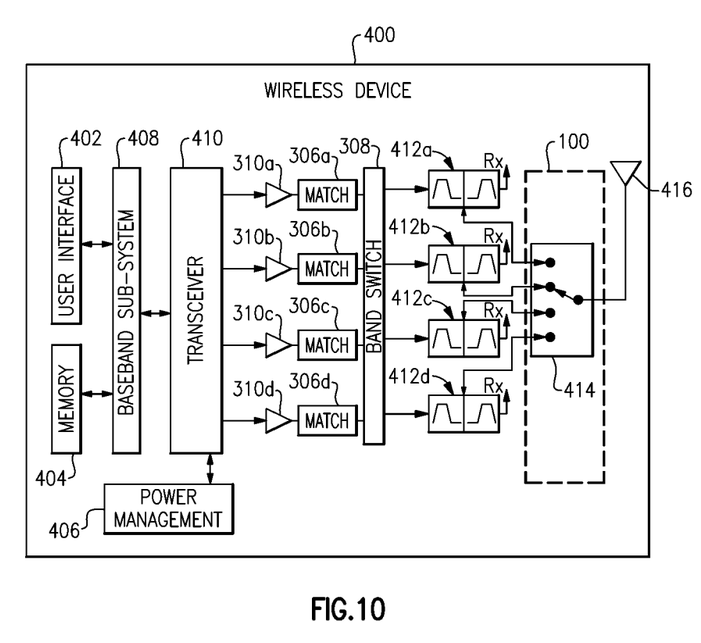
FIG. 10 depicts a wireless device that includes a shielded RF module having one or more features as described herein.

FIG. 10 depicts an example wireless device 400 having one or more advantageous features described herein. In the context of a module having one or more features as described herein, such a module can be implemented for a number of different applications. For example, as generally depicted by a dashed box 100, a shielded packaged module can be implemented as an antenna switch module. It will be understood that such a module can include more or less components than depicted in FIG. 10.

Power amplifiers (PAs) 310 can receive their respective RF signals from a transceiver 410 that can be configured and operated in known manners to generate RF signals to be amplified and transmitted, and to process received signals. The transceiver 410 is shown to interact with a baseband sub-system 408 that is configured to provide conversion between data and/or voice signals suitable for a user and RF signals suitable for the transceiver 410. The transceiver 410 is also shown to be connected to a power management component 406 that is configured to manage power for the operation of the wireless device. Such power management can also control operations of the baseband sub-system 408.

The baseband sub-system 408 is shown to be connected to a user interface 402 to facilitate various input and output of voice and/or data provided to and received from the user. The baseband sub-system 408 can also be connected to a memory 404 that is configured to store data and/or instructions to facilitate the operation of the wireless device, and/or to provide storage of information for the user.

In the example wireless device 400, outputs of the PAs 310 are shown to be matched (via respective match circuits 306) and routed to an antenna 416 through a band selection switch 308, their respective duplexers 412 and an antenna switch 414. In some embodiments, each duplexer 412 can allow transmit and receive operations to be performed simultaneously using a common antenna (e.g., 416). In FIG. 10, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged electronic device comprising:
a ceramic substrate configured to receive one or more components, the ceramic substrate including a conductive layer in electrical contact with a ground plane;
a die having an integrated circuit, the die mounted on a surface of the ceramic substrate;
a conformal conductive coating implemented over the die and on the surface of the ceramic substrate extending to side edges of the ceramic substrate to provide shielding functionality; and
an electrical connection between the conformal conductive coating and the conductive layer.

2. The packaged electronic device of claim 1 wherein the conformal conductive coating is implemented substantially directly on the die.

3. The packaged electronic device of claim 2 wherein the die is configured as a flip-chip device.

4. The packaged electronic device of claim 3 further comprising an underfill implemented between the flip-chip device and the ceramic substrate.

5. The packaged electronic device of claim 4 wherein the underfill includes an edge profile configured to provide an angled transition between side walls of the flip-chip device and the surface of the ceramic substrate.

6. The packaged electronic device of claim 5 wherein the angled transition profile of the underfill is configured to facilitate improved coverage of the conformal conductive coating between the flip-chip device and the ceramic substrate.

7. The packaged electronic device of claim 2 wherein the integrated circuit includes a radio-frequency (RF) switching circuit.

8. The packaged electronic device of claim 7 wherein the die is a silicon-on-insulator (SOI) die.

9. The packaged electronic device of claim 1 wherein the conductive layer includes an edge along a corresponding side edge of the ceramic substrate such that the edge of the conductive layer is in electrical contact with the conformal conductive coating.

10. The packaged electronic device of claim 9 wherein the conductive layer includes a conductive strip along the corresponding side edge of the ceramic substrate.

11. The packaged electronic device of claim 10 wherein the conductive strip includes an edge exposed sufficiently on the corresponding side edge of the ceramic substrate to facilitate the electrical contact between the conductive strip and the conformal conductive coating.

12. The packaged electronic device of claim 11 wherein the conductive layer includes a plurality of the conductive strips arranged such that each edge of the ceramic substrate includes the corresponding exposed edge of the conductive strip in electrical contact with the conformal conductive coating.

13. The packaged electronic device of claim 1 wherein the conformal conductive coating includes a metallic paint layer or a conductive layer formed by deposition.

14. The packaged electronic device of claim 1 wherein the ceramic substrate includes a low-temperature co-fired ceramic (LTCC) substrate.

15. The packaged electronic device of claim 1 further comprising a plurality of contact pads implemented on an underside of the ceramic substrate, the contact pads configured to allow mounting of the packaged electronic device on a circuit board.

16. The packaged electronic device of claim 2 wherein the conformal conductive coating directly on the die results in the packaged electronic device being a low-profile shielded device.

17. The packaged electronic device of claim 1 further comprising an overmold implemented over the die such that the conformal coating is implemented on a surface of the overmold.

18. The packaged electronic device of claim 17 wherein the overmold is dimensioned such that its side walls generally align with corresponding side walls of the ceramic substrate.

19. An RF module configured to process an RF signal, the RF module including:
- a ceramic substrate configured to receive one or more components, the ceramic substrate including a conductive layer in electrical contact with a ground plane;
- a die having an integrated circuit, the die mounted on a surface of the ceramic substrate;
- a conformal conductive coating implemented over the die and on the surface of the ceramic substrate extending to side edges of the ceramic substrate to provide shielding functionality; and
- an electrical connection between the conformal conductive coating and the conductive layer.

20. The RF module of claim 19 wherein the conductive layer includes an edge along a corresponding side edge of the ceramic substrate such that the edge of the conductive layer is in electrical contact with the conformal conductive coating.

* * * * *